United States Patent
Bera et al.

(10) Patent No.: US 8,894,805 B2
(45) Date of Patent: Nov. 25, 2014

(54) ELECTRON BEAM PLASMA SOURCE WITH PROFILED MAGNET SHIELD FOR UNIFORM PLASMA GENERATION

(75) Inventors: Kallol Bera, San Jose, CA (US); Shahid Rauf, Pleasanton, CA (US); Leonid Dorf, San Jose, CA (US); Kenneth S. Collins, San Jose, CA (US); Ajit Balakrishna, Sunnyvale, CA (US); Gary Leray, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 257 days.

(21) Appl. No.: 13/595,452

(22) Filed: Aug. 27, 2012

(65) Prior Publication Data

US 2013/0098883 A1    Apr. 25, 2013

Related U.S. Application Data

(60) Provisional application No. 61/549,362, filed on Oct. 20, 2011.

(51) Int. Cl.
| | |
|---|---|
| H05H 1/46 | (2006.01) |
| H01J 37/32 | (2006.01) |
| H05H 7/00 | (2006.01) |

(52) U.S. Cl.
CPC .......... *H01J 37/3233* (2013.01); *H05H 7/001* (2013.01); *H05H 1/46* (2013.01)
USPC ............ 156/345.29; 156/345.46; 156/345.51

(58) Field of Classification Search
CPC .......... H05H 1/00; H05H 1/46; H05H 7/001; H01L 21/306; C23C 16/00
USPC .......................... 156/345.29, 345.46, 345.51
See application file for complete search history.

(56) References Cited

U.S. PATENT DOCUMENTS

| | | | |
|---|---|---|---|
| 3,755,073 | A | 8/1973 | Haught et al. |
| 5,003,178 | A | 3/1991 | Livesay |
| 5,874,807 | A | 2/1999 | Neger et al. |
| 5,903,106 | A | 5/1999 | Young et al. |
| 6,291,940 | B1 | 9/2001 | Scholte Van Mast |
| 6,348,158 | B1 | 2/2002 | Samukawa |
| 6,407,399 | B1 | 6/2002 | Livesay |
| 6,501,081 | B1 | 12/2002 | Foad et al. |
| 7,547,899 | B2 | 6/2009 | Vanderpot et al. |
| 2002/0004309 | A1* | 1/2002 | Collins et al. ................ 438/719 |
| 2002/0078893 | A1* | 6/2002 | Os et al. ..................... 118/723 I |
| 2002/0168049 | A1 | 11/2002 | Schriever et al. |
| 2004/0104353 | A1 | 6/2004 | Berglund |

(Continued)

FOREIGN PATENT DOCUMENTS

| | | |
|---|---|---|
| JP | 08-222553 A | 8/1996 |
| JP | 2001-085414 A | 3/2001 |

(Continued)

OTHER PUBLICATIONS

U.S. Appl. No. 13/595,134, filed Aug. 27, 2012, Dorf et al.

(Continued)

*Primary Examiner* — Samuel M Heinrich
(74) *Attorney, Agent, or Firm* — Robert M. Wallace

(57) ABSTRACT

A plasma reactor employs an e-beam source to generate plasma, and the e-beam source has a configurable magnetic shield.

19 Claims, 10 Drawing Sheets

(56) References Cited

U.S. PATENT DOCUMENTS

| | | |
|---|---|---|
| 2007/0040130 A1 | 2/2007 | Nanataki et al. |
| 2007/0170414 A1 | 7/2007 | Takai et al. |
| 2007/0278417 A1 | 12/2007 | Horsky et al. |
| 2009/0140176 A1 | 6/2009 | Hershkowitz et al. |
| 2009/0159811 A1 | 6/2009 | Klemm et al. |
| 2010/0032587 A1 | 2/2010 | Hosch et al. |
| 2011/0024047 A1 | 2/2011 | Nguyen et al. |
| 2012/0258601 A1 | 10/2012 | Holland et al. |
| 2012/0258606 A1 | 10/2012 | Holland et al. |
| 2012/0258607 A1 | 10/2012 | Holland et al. |

FOREIGN PATENT DOCUMENTS

| | | |
|---|---|---|
| KR | 10-2005-0008065 A | 1/2005 |
| KR | 10-2007-0041220 A | 4/2007 |
| KR | 10-2009-0008932 A | 1/2009 |
| KR | 10-2010-0042610 A | 4/2010 |

OTHER PUBLICATIONS

U.S. Appl. No. 13/595,201, filed Aug. 27, 2012, Dorf et al.
U.S. Appl. No. 13/595,252, filed Aug. 27, 2012, Dorf et al.
U.S. Appl. No. 13/595,292, filed Aug. 27, 2012, Dorf et al.
U.S. Appl. No. 13/595,351, filed Aug. 27, 2012, Bera et al.
U.S. Appl. No. 13/595,655, filed Aug. 27, 2012, Ramaswamy et al.
U.S. Appl. No. 13/595,612, filed Aug. 27, 2012, Bera et al.
Furman, M.A., et al. "Stimulation of Secondary Electron Emission Based Upon a Phenomenological . . . " LBNL-52807/SLAC-PUB-9912, Jun. 2, 2003, pp. 1-31, Lawrence Berkely Natl. Lab.
U.S. Appl. No. 14/176,365, filed Feb. 10, 2014, Dorf et al.
Official Action issued Jul. 31, 2014 in corresponding U.S. Appl. No. 13/595,292.

\* cited by examiner

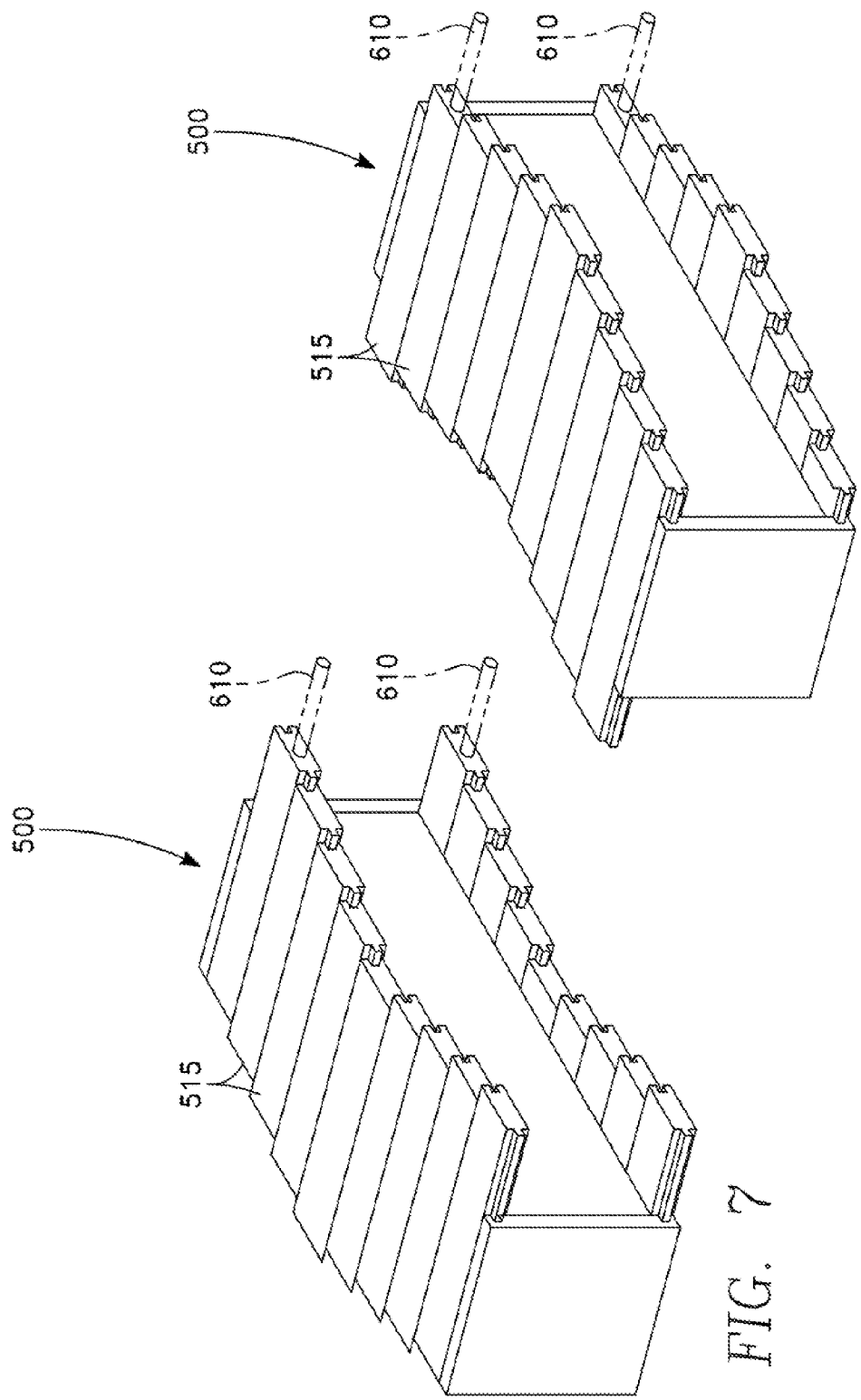

ELECTRON BEAM PLASMA SOURCE WITH PROFILED MAGNET SHIELD FOR UNIFORM PLASMA GENERATION

CROSS-REFERENCE TO RELATED APPLICATIONS

This application claims the benefit of U.S. Provisional Application Ser. No. 61/549,362, filed Oct. 20, 2011 entitled ELECTRON BEAM PLASMA SOURCE WITH PROFILED MAGNET SHIELD FOR UNIFORM PLASMA GENERATION, by Kallol Bera, et al.

BACKGROUND

A plasma reactor for processing a workplace can employ an electron beam as a plasma source. Such a plasma reactor can exhibit non-uniform distribution of processing results (e.g., distribution of etch rate across the surface of a workplace) due to non-uniform density distribution of the electron beam. Such non-uniformities can be distributed in a direction transverse to the beam propagation direction.

SUMMARY

A plasma reactor for processing a workpiece includes a workpiece processing chamber having a processing chamber comprising a chamber ceiling and a chamber side wall and an electron beam opening in the chamber side wall, a workplace support pedestal in the processing chamber having a workpiece support surface facing the chamber ceiling and defining a workpiece processing region between the workpiece support surface and the chamber ceiling, the electron beam opening facing the workpiece processing region. The reactor further includes an electron beam source chamber comprising a source enclosure, the source enclosure defining an electron beam propagation path along a longitudinal direction extending into the workpiece processing region. An electromagnet surrounds the source chamber, the source enclosure and the electron beam opening extending along a transverse direction that is non-parallel to the longitudinal direction. A magnetic shield is disposed between the scarce chamber and the electromagnet, the shield having an edge defining a shield length, the edge having a profile corresponding to a distribution of the shield length along the transverse direction. The distribution of the shield length corresponds to a measured distribution in electron beam density along the transverse direction, that is corrected by the profiling of the shield length.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 7 and 8 are orthographic projections of the shield of FIG. 4 configured into profiles corresponding to FIGS. 3A and 3B respectively.

Figure 1A:
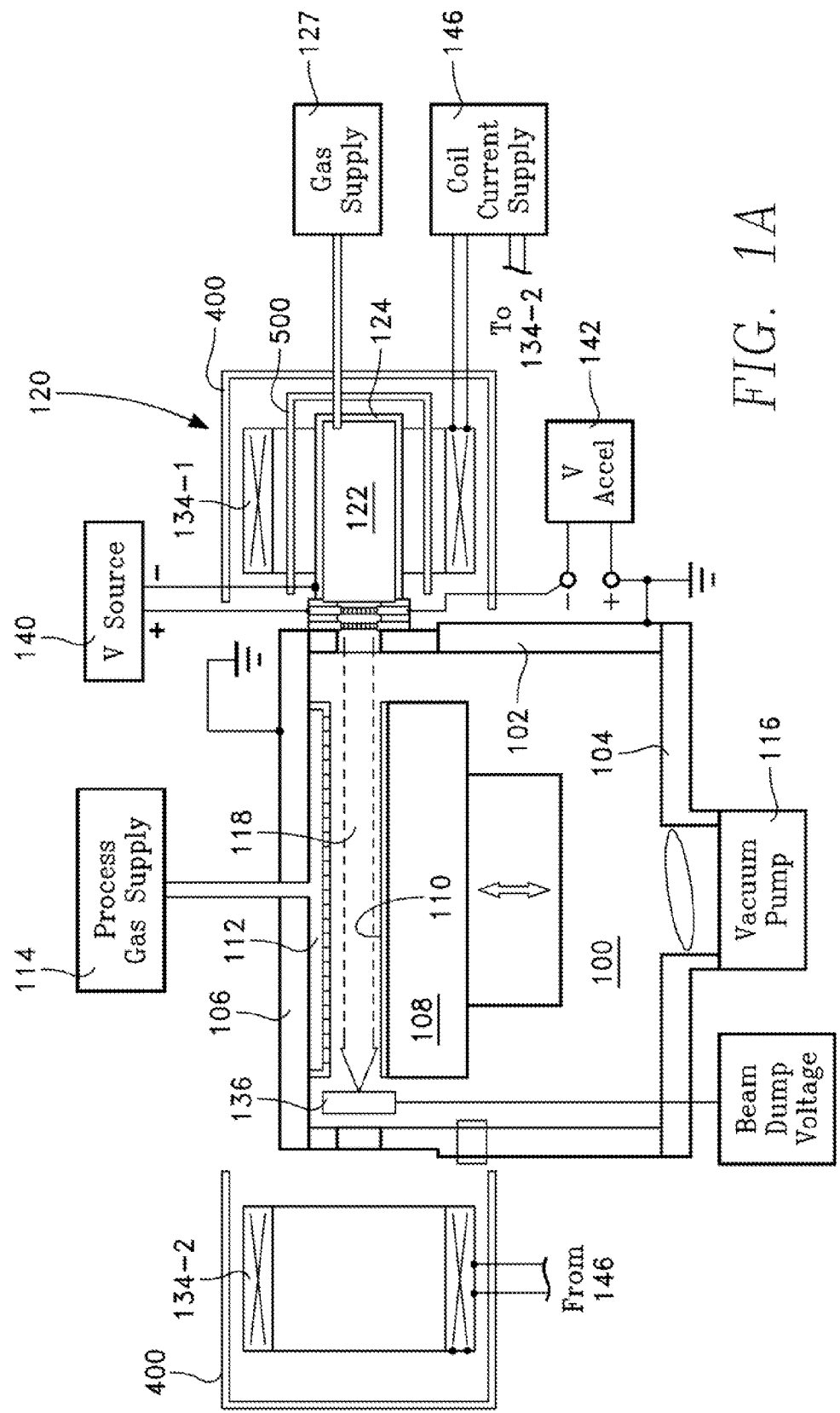
FIGS. 1A, 1B and 1C depict a plasma reactor in accordance with one embodiment in which a magnetic shield is profiled along a transverse direction.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1B:
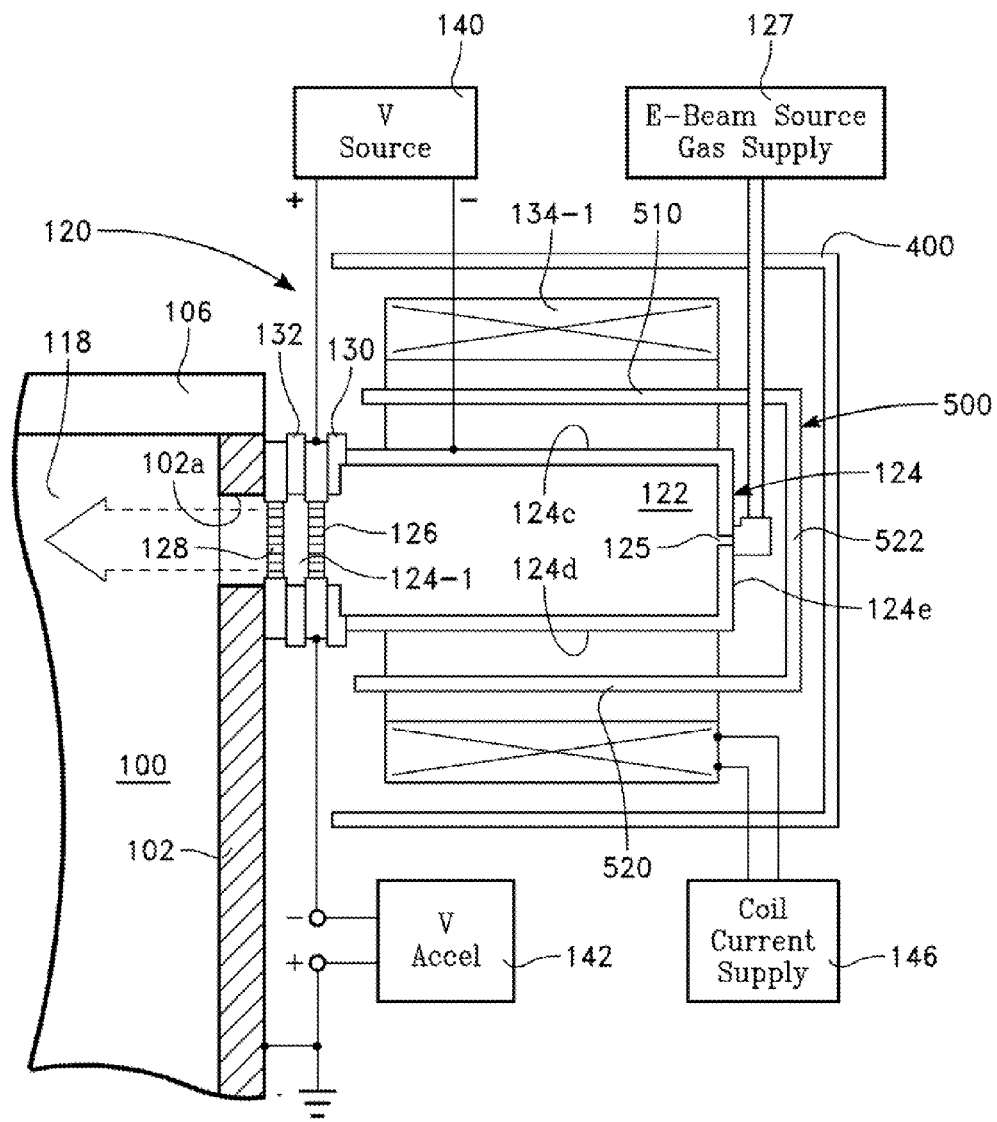
Figure 1C:
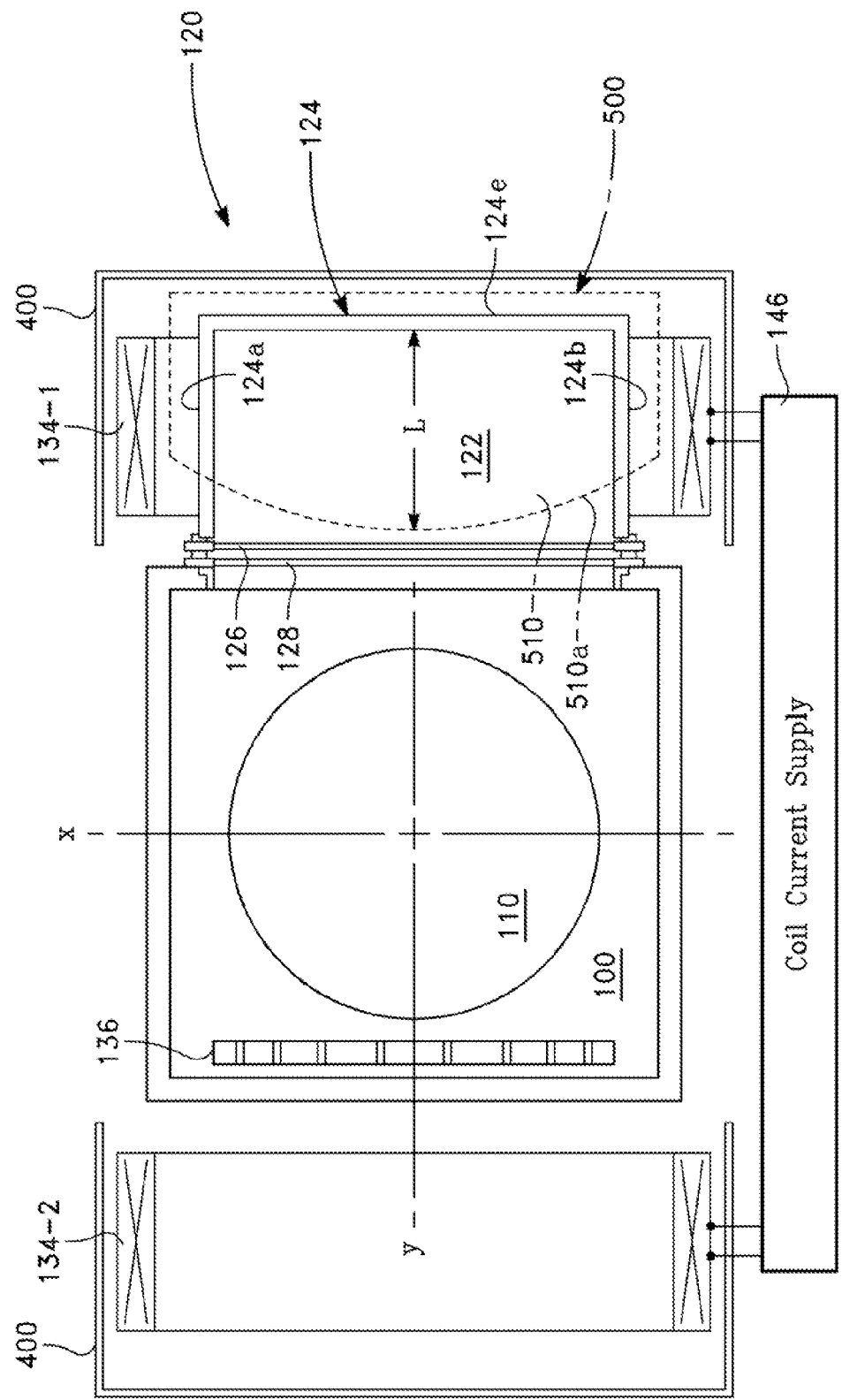

Referring to FIGS. 1A, 1B and 1C, a plasma reactor has an electron beam plasma source. The reactor includes a process chamber 100 enclosed by a cylindrical side wall 102, a floor 104 and a ceiling 106. A workplace support pedestal 108 supports a workpiece 110, such as a semiconductor wafer, the pedestal 108 being movable in the axial (e.g., vertical) direction. A gas distribution plate 112 is integrated with or mounted on the ceiling 106, and receives process gas from a process gas supply 114. A vacuum pump 116 evacuates the chamber through the floor 104. A process region 118 is defined between the workpiece 110 and the gas distribution plate 112. Within the process region 118, the process gas is ionized to produce a plasma for processing of the workpiece 110.

The plasma is generated in process region 118 by an electron beam from an electron beam source 120. The electron beam source 120 includes a plasma generation chamber 122 outside of the process chamber 100 and having a conductive enclosure 124. The conductive enclosure 124 may be rectangular and include side walls 124a and 124b, a ceiling 124c, a floor 124d and a back wall 124e. The conductive enclosure 124 has a gas inlet or neck 125. An electron beam source gas supply 127 is coupled to the gas inlet 125. The conductive enclosure 124 has an opening 124-1 facing the process region 118 through an opening 102a in the sidewall 102 of the process chamber 100.

The electron beam source 120 includes an extraction grid 126 between the opening 124-1 and the plasma generation chamber 122, and an acceleration grid 128 between the extraction grid 126 and the process region 118, best seen in the enlarged view of FIG. 1B. The extraction grid 126 and the acceleration grid 128 may be formed as separate conductive meshes, for example. The extraction grid 126 and the acceleration grid 128 are mounted with insulators 130, 132, respectively, so as to be electrically insulated from one another and from the conductive enclosure 124. However, the acceleration grid 128 is in electrical contact with the side wall 102 of the chamber 100. The openings 124-1 and 102a and the extraction and acceleration grids 126, 128 can be mutually congruent, and define a thin wide beam flow path for an electron beam into the processing region 118. The width of the beam flow path is about the diameter of the workplace 110 (e.g., 100-500 mm) while the height of the beam flow path is less than about two inches.

The electron beam source 120 further includes a pair of electromagnets 134-1 and 134-2 adjacent opposite sides of the chamber 100, the electromagnet 134-1 surrounding the electron beam source 120. The two electromagnets 134-1 and 134-2 may be symmetrical along the direction of beam propagation, and produce a magnetic field parallel to the direction of the electron beam along an electron beam path. The electromagnets 134-1 and 134-2 may be rectangular in shape, and may be oriented parallel with the rectangular conductive enclosure 124. The electron beam flows across the processing region 118 over the workpiece 110, and is absorbed on the opposite side of the processing region 118 by a beam dump 136. The beam dump 136 is a conductive body having a shape adapted, to capture the wide thin electron beam.

A plasma D.C. discharge voltage supply 140 is coupled to the conductive cathode enclosure 124. One terminal of an electron beam acceleration voltage supply 142 is connected to the extraction grid 126 and referenced to the ground potential of the sidewall 102 of the process chamber 100. A coil current supply 146 is coupled to the electromagnets 134-1 and 134-2. Plasma is generated within the chamber 122 of the electron beam source 120 by a D.C. gas discharge produced by power from the voltage supply 140, to produce a plasma throughout the chamber 122. This D.C. gas discharge is the plasma source of the electron beam source 120. Electrons are extracted from the plasma in the chamber 122 through the extraction grid 126 and accelerated through the acceleration grid 128 due to a voltage difference between the acceleration grid and the extraction grid to produce an electron beam that flows into the processing chamber 100.

Outer shields 400 surround the electromagnets 134-1 and 134-2 and may be formed of a magnetically permeable material. Each outer shield 400 may be rectangular and aligned with the electromagnet 134-1.

The distribution of electron density along the width of the beam (along the X-axis or direction transverse to beam travel) affects the uniformity of plasma density distribution in the processing region 118. The electron beam may have a non-uniform distribution. Such non-uniformity may be caused by electron drift due to the interaction of the bias electric field with the magnetic field, divergence of electron beam due to electron-electron interactions and/or electron collision with neutral gas in the process chamber. Such non-uniformity may also be caused by fringing of an electric field at the edge of the electron beam. The distribution of electron density along the width of the beam (along the X-axis or direction transverse to beam travel) is liable to exhibit non-uniformities due to the foregoing causes.

Figure 1D:
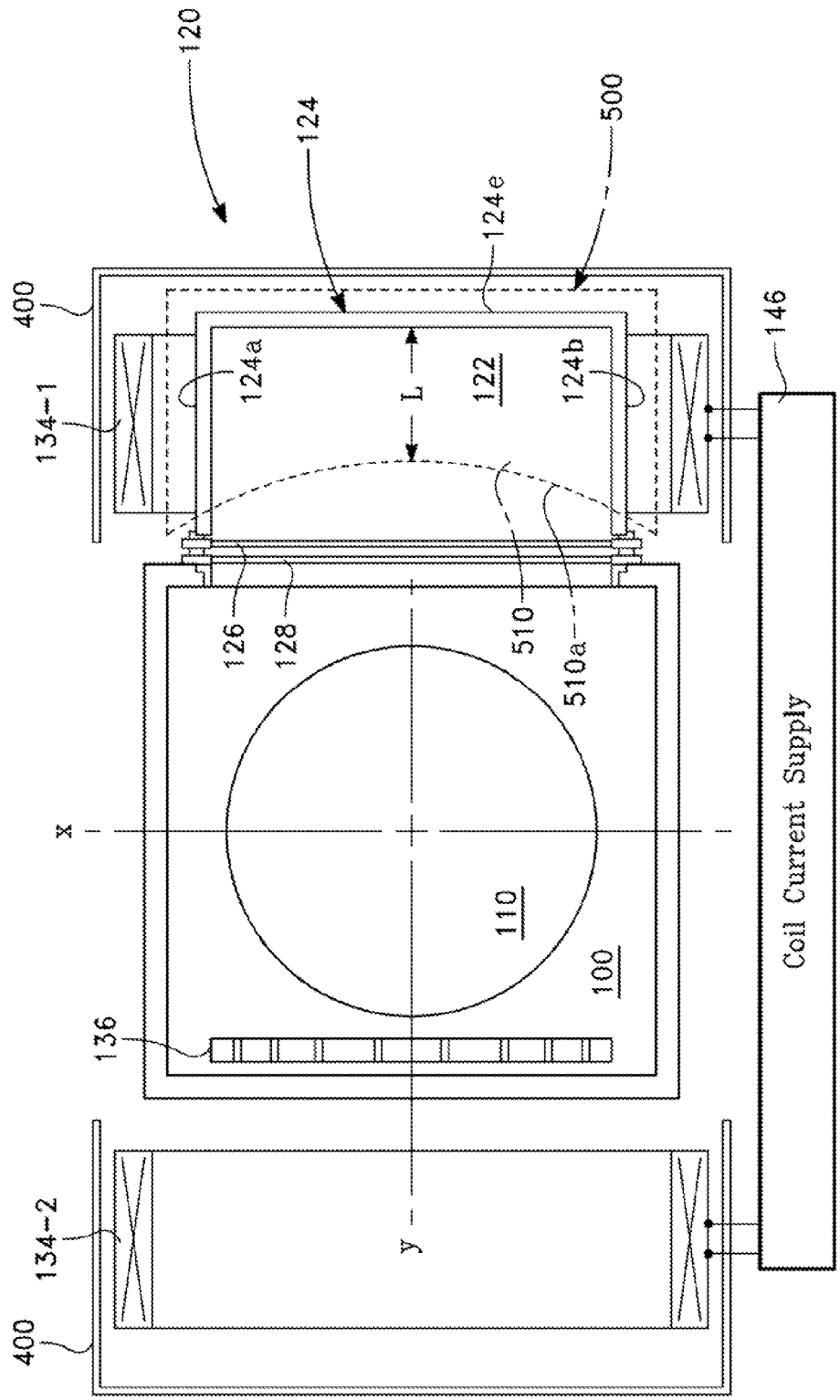
FIG. 1D depicts a plasma reactor in accordance with a second embodiment employing a different shield profile.
Figure 2B:
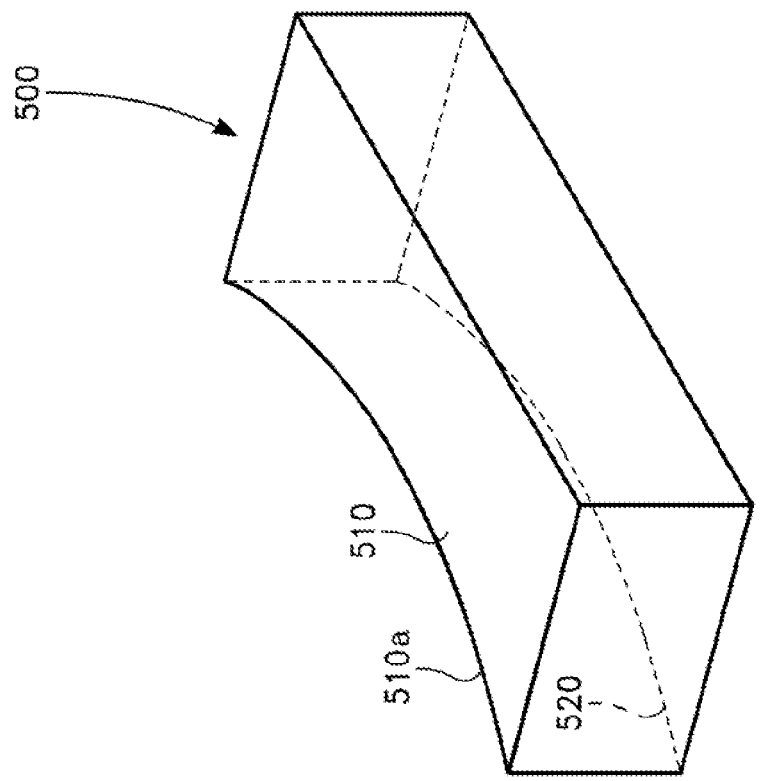
FIGS. 2A and 2B are orthographic projections of profiled shields of the embodiments of FIGS. 1C and 1D respectively.
Figure 2A:
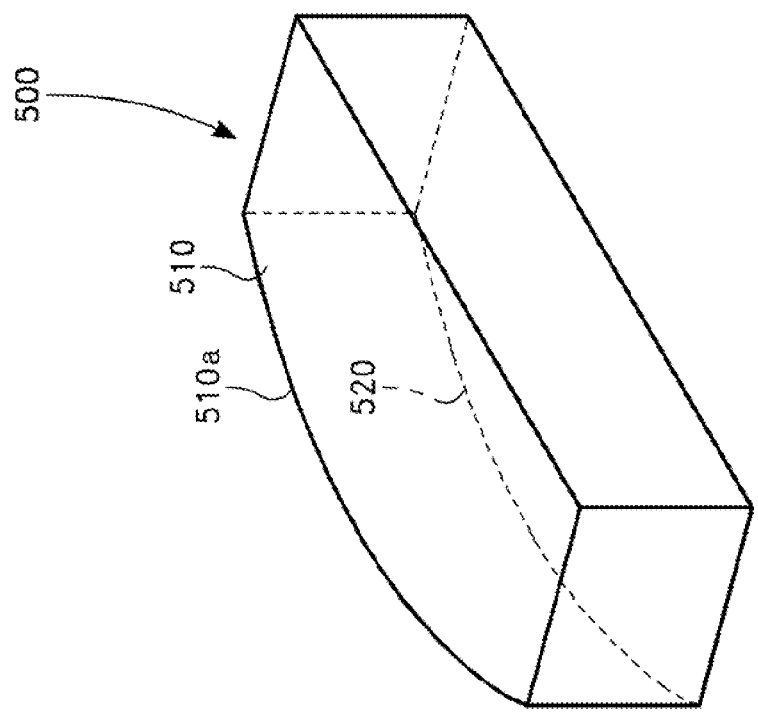

An inner shield 500 is placed between the conductive enclosure 124 and the electromagnet 134-1. The inner shield 500 includes a top shield 510 overlying the ceiling 124*c* of the conductive housing 124, and a bottom shield 520 underlying the floor 124*d* of the conductive enclosure 124. Optionally, as shown in FIG. 1B, the top and bottom shields 510, 520 may be connected together by a back portion 522, although this feature may not be required. A leading edge 510*a* of the top shield 510 defines a shielded region of the plasma generation chamber 122 having a length L (FIG. 1C) extending from a plane of the back wall 124*e* to the leading edge 510*a*. The length L may be referred to as shield length, because it defines the extent of the shielded portion of the plasma generation chamber 122. The plasma generation chamber 122 has a chamber length extending from the back wall 124*e* to the extraction grid 126. To the extent that the shield length L is less than the chamber length, a portion of the plasma generation chamber 122 is unshielded by the top shield 510 while the remainder is shielded. In FIG. 1C the leading edge 510*a* is profiled in that it is curved, although in other embodiments it may be profiled by being stepped, as will be described below. As a result, the shield length L (FIG. 10), which lies along the beam propagation direction (the Y axis or axial direction) is profiled, along the transverse direction (X-axis). Similarly, the bottom shield 520 may be profiled along the transverse direction. In the embodiment of FIG. 1C, the profile of the top shield 510 is convex, that is, it is longest near its center and shorter at each side edge. FIG. 2A is an orthographic projection of the convex shield 500 of FIG. 1C, in an embodiment in which the top and bottom shields 510 and 520 are profiled in a similar manner. In the embodiment of FIG. 1D, the profile of the top shield is concave. Specifically, it has the shortest shield length L near its center and the longest shield length at each side edge. FIG. 2B is an orthographic projection of the concave shield 500 of FIG. 1D. The bottom shield 520 may be profiled in the same manner as the top shield 510, as depicted in FIGS. 2A and 2B, or it may have a different profile or it may have a straight leading edge so as to have no profile. Alternatively, the top shield 510 may have a straight leading edge while the bottom shield 520 may have a profiled leading edge.

Profiling of the magnetic shields 510, 520 affects the distribution of magnetic field, flux density along the transverse direction. The magnetic field of the electromagnets 134-1 and 134-2 confines the electron beam, enhancing its plasma electron density. The shields 510 and 520 attenuate the magnetic field, thereby attenuating plasma electron density in the electron beam. Profiling of either or both shields 510 and 520 attenuates the beam density in those regions that are shielded, while leaving the electron beam density in the unshielded regions unattenuated and therefore greater). This creates a corresponding profile of electron density distribution along the transverse direction. For example, a longer shield, length L at a certain point along the transverse direction reduces plasma electron density at that point relative to other locations where the shield length L is shorter. In the embodiment of FIG. 1C, the ratio between the shield, length L and the chamber length at the center of the X-axis is nearly 100% (for maximum electron beam density attenuation), while this ratio is approximately 70% near each of side walls 124*a* and 124*b* (for least electron beam density attenuation). Thus, the convex shape of the top shield 510 tends to render plasma electron distribution along the transverse direction center low and edge high, and is therefore suitable when the uncorrected distribution is center high. In the embodiment of FIG. 1D, the concave shape of the top shield 510 tends to render plasma electron distribution along the transverse direction center high and edge low, and is therefore suitable when the uncorrected distribution is center low. In some cases, the desired effect may be achieved when the profile is flat, neither convex nor concave.

Figure 3A:
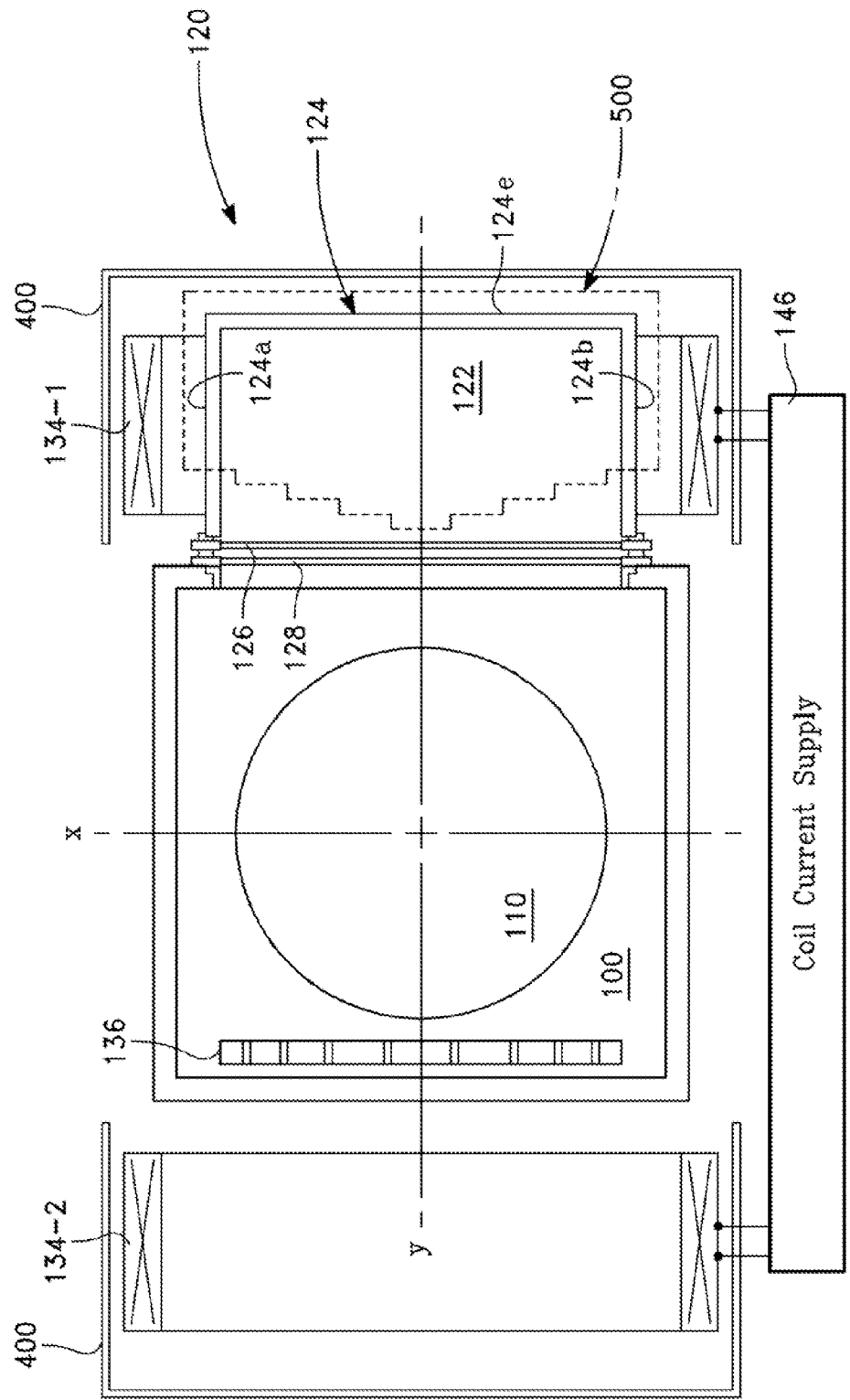
FIGS. 3A and 3B depict modifications of the embodiments of FIGS. 2A and 2B respectively, employing stepped profiling.
Figure 3B:
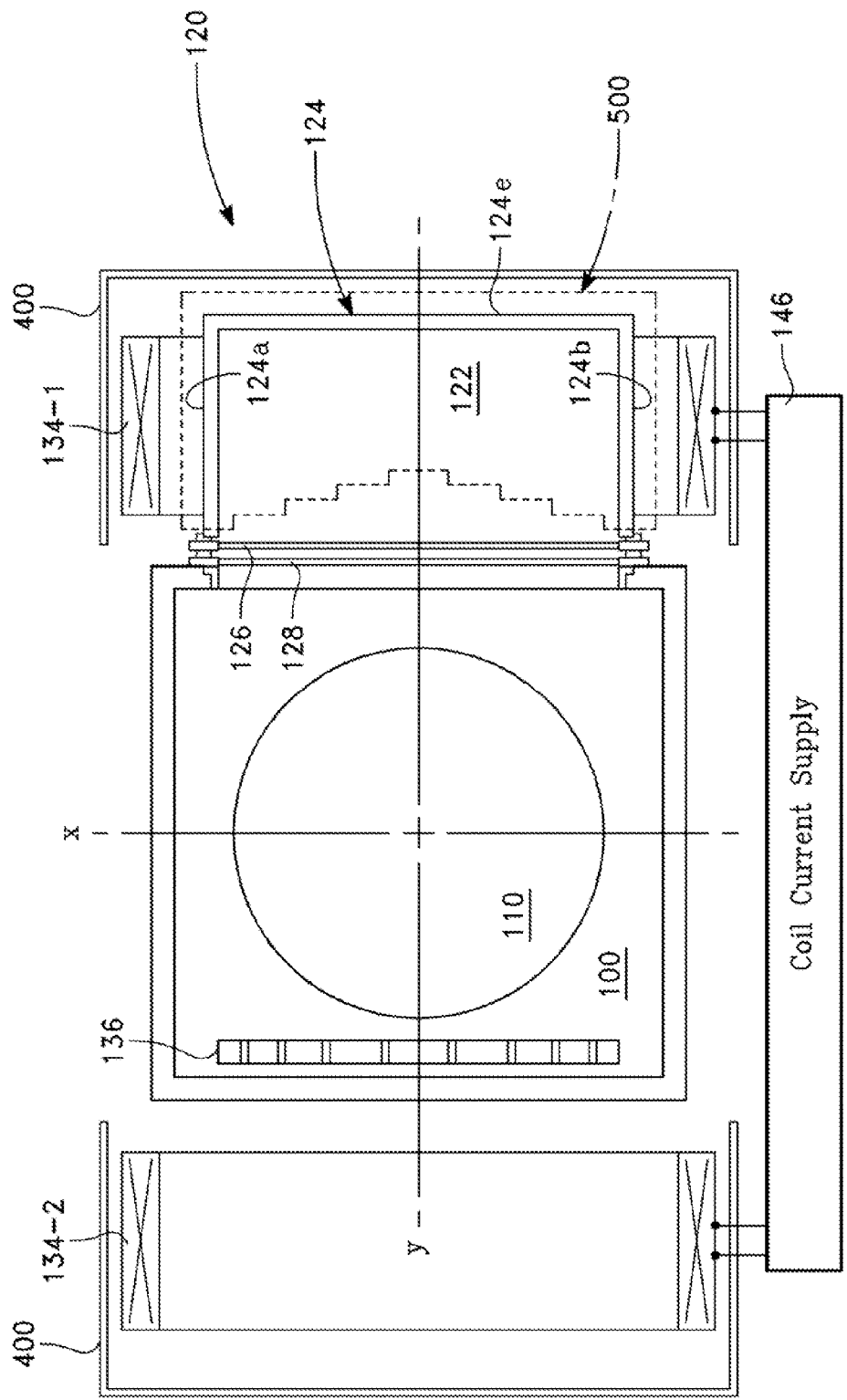

FIGS. 3A and 3B depict embodiments in which the profiling of FIGS. 1C and 2D, respectively, is implemented in a stepped manner.

Figure 4:
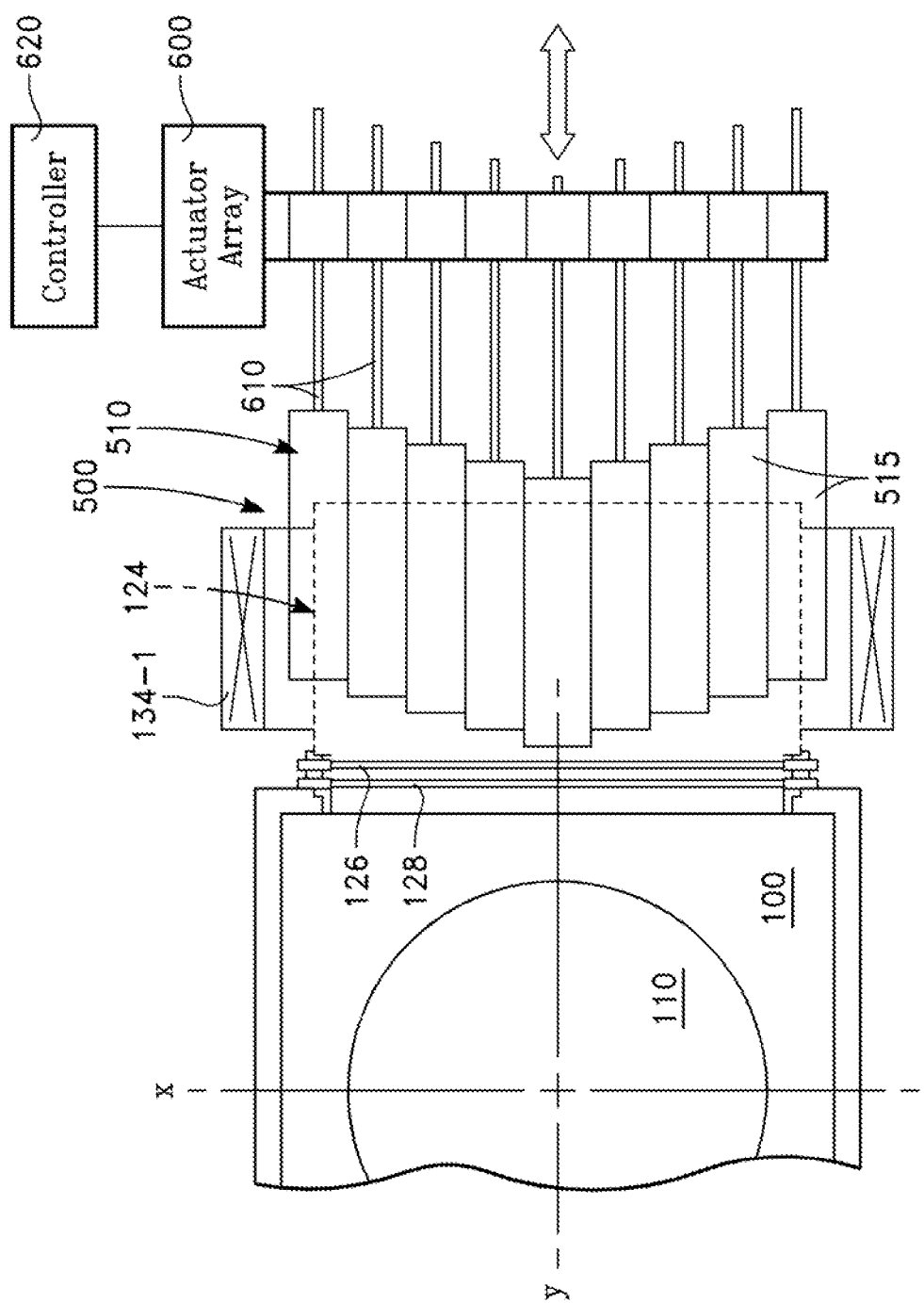
FIG. 4 depicts an embodiment that may be configured according to the profiles of FIGS. 3A and 3B.

FIG. 4 depicts an embodiment that may be transformed between different stepped configurations, including the stepped configurations of FIGS. 3A and 3B. In FIG. 4, the top shield 510 is divided into elongated slats 515 which may be moved back and forth relative to one another along the direction of beam propagation. Although not shown in FIG. 4, the bottom shield 520 is similarly divided into elongated slats movable relative to one another along the direction of beam propagation. An actuator array 600 is linked by individually actuated arms 610 to the individual slats 515. A controller 620 governing the actuator array 600 enables a user to configure the slats 515 in any stepped profile, including the convex profile of FIG. 3A and the concave profile of FIG. 3B, for example. The magnetic shield configuration as defined by the slat positions can be changed independently with time from one process step to another process step or within one process step as necessary using the actuator array.

Figure 5:
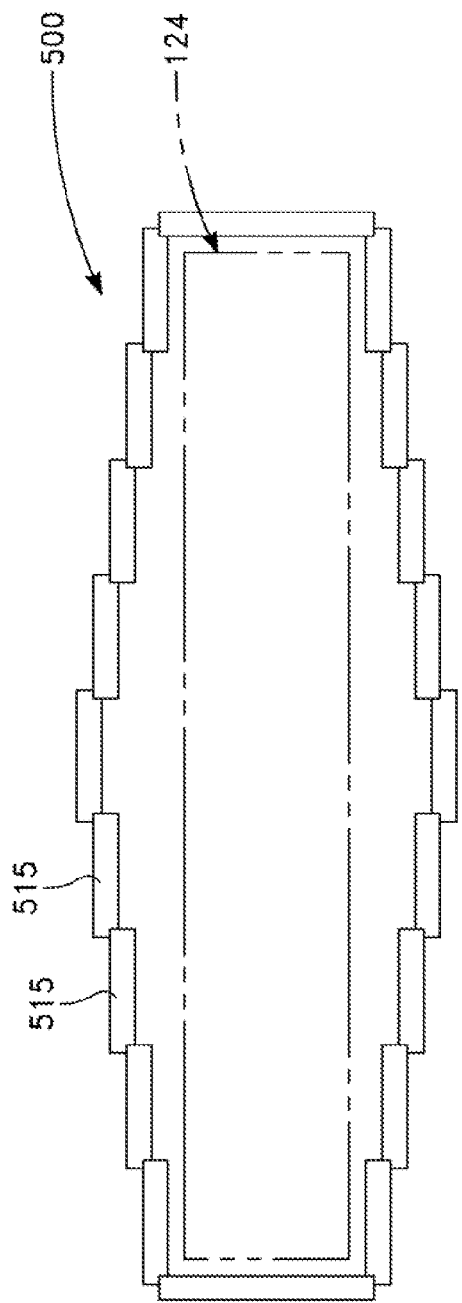
FIGS. 5 and 6 depict different embodiments for overlapping adjacent shield slats.
Figure 6:
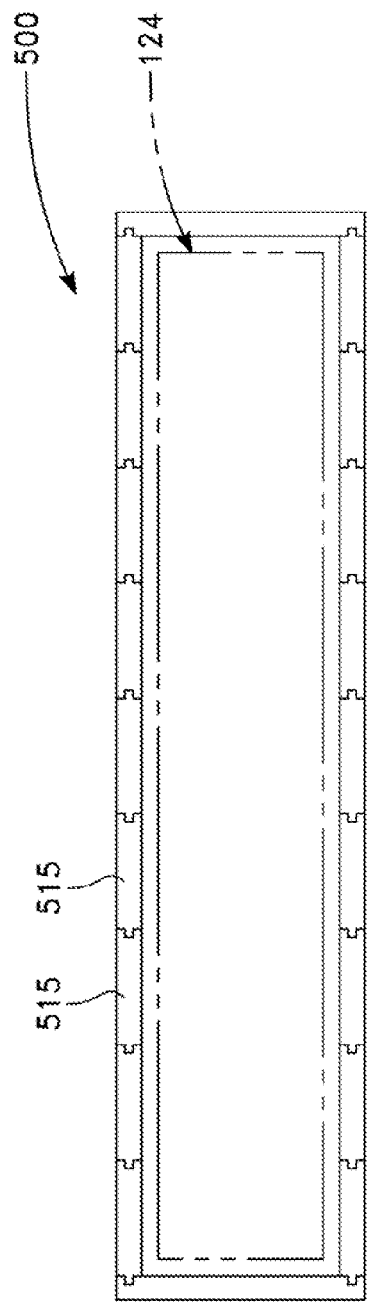

FIG. 5 depicts an embodiment in which the individual slats 515 overlap one another. FIG. 6 depicts and embodiment in which the individual slats 515 are interlaced. FIG. 7 is an orthographic projection of the shield 500 of FIG. 4 configured in a convex profile. FIG. 8 is an orthographic projection of the shield 500 configured in a concave profile.

While the main plasma source in the electron beam source 120 is a D.C. gas discharge produced by the voltage supply 140, any other suitable plasma source may be employed instead as the main plasma source. For example, the main plasma source of the electron beam source 120 may be a toroidal RF plasma source, a capacitively coupled RF plasma source, or an inductively coupled RF plasma source.

While the foregoing is directed to embodiments of the present invention, other and further embodiments of the invention may foe devised without departing from the basic scope thereof, and the scope thereof is determined by the claims that follow.

What is claimed is:

1. A plasma reactor for processing a workpiece, comprising:
   a processing chamber comprising a chamber ceiling and a chamber side wall and an electron beam opening in said chamber side wall, a workpiece support pedestal in said processing chamber having a workpiece support surface facing said chamber ceiling and defining a workpiece processing region between said workpiece support surface and said chamber ceiling, said electron beam opening facing said workpiece processing region;
   an electron beam source chamber comprising a source enclosure, said source enclosure defining an electron beam propagation path along a longitudinal direction extending into said workpiece processing region;
   an electromagnet surrounding said source chamber, said source enclosure and said electron beam opening extending along a transverse direction that is non-parallel to said longitudinal direction; and
   a shield disposed between said source chamber and said electromagnet, said shield having an edge defining a shield length, said edge having a profile corresponding to a distribution of said shield length along said transverse direction.

2. The plasma reactor of claim 1 wherein said distribution of said shield length corresponds to a distribution in electron beam density along said transverse direction.

3. The plasma reactor of claim 1 wherein said distribution of said shield length along said transverse direction corresponds to a measured distribution in electron beam density distribution along said transverse direction.

4. The plasma reactor of claim 1 wherein said distribution of said shield length along said transverse direction is center-low, wherein said shield length has a minimum value at a center location of said shield along said transverse direction.

5. The plasma reactor of claim 4 wherein said reactor has a measured distribution of plasma density along said transverse direction that is center-low in absence of said shield.

6. The plasma reactor of claim 1 wherein said distribution of said shield length along said transverse direction is center-high, wherein said shield length has a maximum value at a center location of said shield along said transverse direction.

7. The plasma reactor of claim 6 wherein said reactor has a measured distribution of plasma density distribution along said transverse direction that is center-high in absence of said shield.

8. The plasma reactor of claim 1 wherein said distribution of said shield length along said transverse direction has a variance of least 1%.

9. The plasma reactor of claim 1 wherein said distribution of said shield length along said transverse direction has a variance of at least 5%.

10. The plasma reactor of claim 1 wherein shield is configurable for changing said profile.

11. The plasma reactor of claim 1 wherein said source chamber comprises a back wall, a floor and a ceiling facing said floor, and wherein said shield comprises a top shield between said ceiling of said source chamber and said electromagnet, said top shield comprising a profiled top shield leading edge.

12. The plasma reactor of claim 11 wherein said shield length corresponds to a distance between said top shield leading edge and a plane of said back wall of said source chamber.

13. The plasma reactor of claim 11 wherein said shield further comprises a bottom shield between said floor and said electromagnet, said bottom shield comprising a profiled bottom shield leading edge.

14. The plasma reactor of claim 1 wherein said shield comprises plural parallel slats movable along said longitudinal direction independently of one another and disposed side-by-side.

15. The plasma reactor of claim 14 wherein said slats overlap one another.

16. The plasma reactor of claim 14 further comprising an actuator array separately coupled to said plural parallel slats.

17. The plasma reactor of claim 14 wherein said plural parallel slats are configurable in a convex profile or a concave profile or a flat profile.

18. The plasma reactor of claim 14 wherein said plural slat configuration corresponds to a measured distribution in electron beam density distribution along said transverse direction.

19. The plasma reactor of claim 14 wherein said plural parallel slats can be moved independent of each other with time during plasma processing.

\* \* \* \* \*